(12) United States Patent
Giesen et al.

(10) Patent No.: US 11,968,780 B2
(45) Date of Patent: Apr. 23, 2024

(54) METHOD TO MANUFACTURE CONDUCTIVE ANODIC FILAMENT-RESISTANT MICROVIAS

(71) Applicant: INTERNATIONAL BUSINESS MACHINES CORPORATION, Armonk, NY (US)

(72) Inventors: Kyle Indukummar Giesen, Lagrangeville, NY (US); Sarah K. Czaplewski-Campbell, Rochester, MN (US); Roger S. Krabbenhoft, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 64 days.

(21) Appl. No.: 17/805,229

(22) Filed: Jun. 2, 2022

(65) Prior Publication Data

US 2023/0397331 A1     Dec. 7, 2023

(51) Int. Cl.
| | |
|---|---|
| *H05K 1/03* | (2006.01) |
| *H05K 1/11* | (2006.01) |
| *H05K 3/00* | (2006.01) |
| *H05K 3/42* | (2006.01) |

(52) U.S. Cl.
CPC .......... *H05K 1/0366* (2013.01); *H05K 1/115* (2013.01); *H05K 3/0047* (2013.01); *H05K 3/429* (2013.01); *H05K 2201/029* (2013.01)

(58) Field of Classification Search
CPC ........ H05K 1/03; H05K 1/0306; H05K 1/038; H05K 1/0366; H05K 1/09; H05K 1/115; H05K 2201/01; H05K 2201/029; H05K 2201/09581
See application file for complete search history.

(56) References Cited

U.S. PATENT DOCUMENTS

| | | |
|---|---|---|
| 8,974,888 B2 | 3/2015 | Balcome |
| 9,456,496 B2 | 9/2016 | Chamberlin |
| 9,986,637 B2 | 5/2018 | Chamberlin |

(Continued)

FOREIGN PATENT DOCUMENTS

| | | |
|---|---|---|
| CN | 1830234 A | 9/2006 |
| CN | 202183910 U | 4/2012 |

(Continued)

OTHER PUBLICATIONS

International Application No. PCT/CN2023/083337, Notification of Transmittal of the International Search Report and the Written Opinion of the International Searching Authority, mailed Jun. 19, 2023, 8 pgs.

(Continued)

*Primary Examiner* — Hoa C Nguyen
*Assistant Examiner* — John B Freal
(74) *Attorney, Agent, or Firm* — Kimberly S. Zillig

(57) ABSTRACT

An electronic printed circuit board structure for mitigating conductive anodic filament growth. The structure includes at least two conductive layers and a dielectric layer sandwiched between the conductive layers. At least one hole extends through the dielectric layer, and a layer of nonconductive material covers the at least one hole, wherein the nonconductive material is glass-free. A conductive plate layer is disposed over the nonconductive material layer to form a via connection in the structure.

5 Claims, 7 Drawing Sheets

(56) References Cited

U.S. PATENT DOCUMENTS

| | | |
|---|---|---|
| 10,774,266 B2 | 9/2020 | Hu |
| 2003/0038344 A1* | 2/2003 | Palmer .................. H01L 23/15 |
| | | 257/E21.597 |
| 2008/0164057 A1 | 7/2008 | Mori |
| 2011/0009527 A1 | 1/2011 | Hoevel |
| 2012/0012553 A1 | 1/2012 | Japp |
| 2012/0141753 A1 | 6/2012 | Hunrath |
| 2012/0180312 A1* | 7/2012 | Zhang ................. H05K 3/4038 |
| | | 29/846 |
| 2020/0270413 A1 | 8/2020 | Koes |

FOREIGN PATENT DOCUMENTS

| | | |
|---|---|---|
| CN | 101797825 B | 7/2012 |
| EP | 3474640 A1 | 4/2019 |
| KR | 1020110052281 A | 5/2011 |

OTHER PUBLICATIONS

Disclosed Anonymously, "Method to Mitigate Hollow Filament Failures in PCBs," (Feb. 16, 2017), IPCOM000249306D, https://priorart.ip.com/IPCOM/000249306.

Guide to PCB CAF Issues—Millennium Circuits Limited (2021), https://www.mclpcb.com/blog/guide-pcb-caf-issues/. Retrieved from the internet on Mar. 25, 2022.

W.J. Ready and L.J. Turbini, "The Effect of Flux Chemistry, Applied Voltage, Conductor Spacing, and Temperature on Conductive Anodic Filament Formation" Journal of Electronic Materials, vol. 31, No. 11, 2002, pp. 1208-1224.

\* cited by examiner

METHOD TO MANUFACTURE CONDUCTIVE ANODIC FILAMENT-RESISTANT MICROVIAS

BACKGROUND

The present disclosure relates to printed circuit boards (PCBs) containing resin reinforced with glass fibers. More particularly, the present disclosure provides a process to mitigate or minimize conductive anodic filament (CAF) growth in PCBs.

PCBs are commonly constructed of conductive and dielectric layers laminated together. One of the dielectric layers can be sandwiched between two conductive layers, for example. The dielectric layers are commonly constructed of a glass cloth or other glass fiber substrate impregnated with a resin coating (e.g., epoxy-based resin). The glass cloth is typically constructed of bundles of glass fibers woven together in an orthogonal fashion, with the bundles typically being perpendicular to each other.

SUMMARY

According to some embodiments of the disclosure, there is provided an electronic printed circuit board structure for mitigating conductive anodic filament growth. The structure includes at least two conductive layers and a dielectric layer sandwiched between the conductive layers. At least one hole extends through the dielectric layer, and a layer of nonconductive material covers the at least one hole, wherein the nonconductive material is glass-free. A conductive plate layer is disposed over the nonconductive material layer to form a via connection in the structure.

According to some embodiments of the disclosure, there is provided a method to mitigate conductive anodic filament growth in a printed circuit board. One operation of the method is drilling at least one first hole into the printed circuit board, including a dielectric layer having a glass weave, to a desired depth. Another operation is filling the at least one first hole with a nonconductive resin. Yet another operation is drilling at least one second hole into the nonconductive resin, wherein the at least one second hole is smaller in diameter than the at least one first hole, leaving a layer of nonconductive resin behind on the circumference of the dielectric layer. A further operation is plating the at least one second hole with a conductive material to form a connection, wherein the plated conductive material is separated from the glass weave in the dielectric layer by the layer of nonconductive resin.

According to some embodiments of the disclosure, there is provided a method to mitigate conductive anodic filament growth in a printed circuit board. One operation of the method is drilling at least one first hole into the printed circuit board to a desired depth, wherein the printed circuit board includes: a plurality of conductive layers, and at least one dielectric layer, wherein each dielectric layer is sandwiched between two of the plurality of conductive layers, and the at least one dielectric layer includes resin reinforced by woven glass fibers. Another operation is filling the at least one first hole with a nonconductive resin. Yet another operation is drilling at least one second hole into the nonconductive resin, wherein the at least one second hole is smaller in diameter than the at least one first hole, leaving a layer of nonconductive resin behind on the dielectric layer, and the at least one second hole extends between the plurality of conductive layers. A further operation is plating the at least one second hole with a conductive material to form a connection, wherein the plated conductive material is separated from the dielectric layer by the layer of nonconductive resin.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

Figure 1:
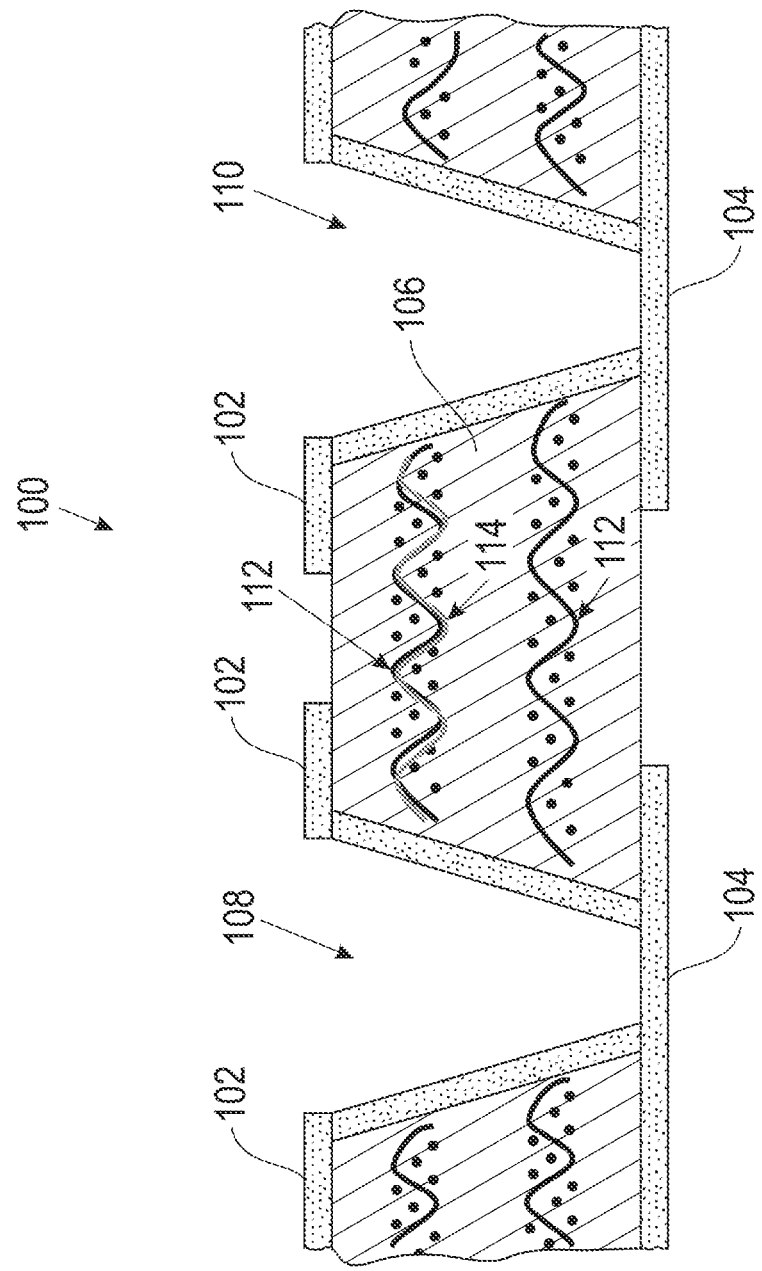
FIG. 1 is a schematic illustration of a cross-sectional view of a portion of a PCB including a conductive anodic filament (CAF), in accordance with embodiments of the disclosure.

While the disclosure is amenable to various modifications and alternative forms, specifics thereof have been shown by way of example in the drawings and will be described in detail. It should be understood, however, that the intention is not to limit the disclosure to the particular embodiments described. On the contrary, the intention is to cover all modifications, equivalents, and alternatives falling within the spirit and scope of the disclosure.

DETAILED DESCRIPTION

Aspects of the present disclosure relate to PCBs containing resin reinforced with glass fibers. More particularly, the present disclosure provides a process to mitigate or minimize CAF growth in PCBs. While the present disclosure is not necessarily limited to such applications, various aspects of the disclosure can be appreciated through a discussion of various examples using this context.

PCBs are commonly constructed of conductive and dielectric layers laminated together. The dielectric layers are commonly constructed of a glass cloth or other glass fiber substrate impregnated with a resin coating (e.g., epoxy-based resin). One problem experienced with such traditional resin/glass PCBs is known as CAF growth. A conductive anodic filament (CAF) is an unintentional conductive path that forms over time and can lead to a short circuit between vias at a different voltage potential within a PCB. CAF growth can be a major topic of concern in PCB design and manufacturing, which is becoming more relevant as via pitches decrease and power levels rise. Pitches in PCBs are the center-to-center distances between the holes or vias in the PCBs. The presence of the conditions that can form a CAF can be difficult to detect, and can lead the structure of the PCB to be deleteriously affected with the lifespan of the PCB being possibly shortened.

Electrical interconnection between electrically conductive paths of patterned copper in the various layers of multi-layer PCBs typically is accomplished through vias. Vias or holes often are formed by drilling holes and plating the paths through the holes forming the vias or plated through holes. The vias or plated through holes (PTHs) form electrical interconnections between intersected copper patterns in each of the PCB layers. PTHs are holes drilled (typically mechanically) all the way through the PCB which includes multiple layers. Vias, such as microvias, can connect adjacent layers and are typically smaller in diameter than PTHs. In many embodiments, microvias are formed by a laser rather than a mechanical drill, but a mechanical drill is also possible.

Another type of via in PCBs can be a skip via. A skip via is a type of microvia that can span a few layers of the PCB rather than just adjacent layers. Skip vias are also commonly formed by laser drilling but could also be mechanically formed.

Generally, in locations on PCBs where there are sources of copper, an electrical bias, glass fiber, and moisture, a potential exists for the formation of a CAF. CAF growth results from copper dissolution that emanates from an anode of an anode/cathode pair and "grows" subsurface toward the cathode of the anode/cathode pair, frequently along separated glass fiber/resin coating interfaces. One path for a CAF to occur can be along the glass weave used as reinforcement within PCBs, and within the individual glass fibers within the PCB where an undesired conductive path may form. In essence, a conductive filament of copper salts may grow along or within one or more of the glass fibers when there is both an electrical bias and moisture present, such as when an electronic device operates in a high humidity environment. The conductive filament may eventually grow to a sufficient length to short together two features (i.e., the anode/cathode pair) that should not be connected, such as adjacent PTH vias in the PCB, and can cause the lifespan of the PCB to be shortened.

A predominant CAF pathway is from PTH via to PTH via along a glass fiber bundle. With PCBs, anode/cathode pairs can be adjacent PTHs, for example. CAFs are also commonly found between via walls and either another via wall or an adjacent conductive plane. Typically, a PCB contains a plurality of vias, each electrically connecting a conductive trace on one layer of the PCB to one or more conductive traces on one or more other layers of the PCB.

FIG. 1 schematically illustrates an example of CAF growth in a PCB. The figure shows a cross-section of a portion of a PCB 100 with an outer conductive layer 102 and an inner conductive layer 104, and with a dielectric layer 106 located or sandwiched therebetween. Two microvias 108, 110 are located in the PCB 100, and form an anode/cathode pair. Two (2) glass weaves 112 are shown enlarged for illustrative purposes within dielectric layer 106. A CAF pathway 114 is shown formed along one of the glass weaves 112, and extending between the two microvias 108, 110. The two microvias 108, 110, can constitute an anode/cathode pair due to an electrical bias between the microvias 108, 110. An exemplary CAF pathway 114 is illustrated in FIG. 1 along a glass fiber bundle 112.

For simplification purposes, FIG. 1, and other figures, show two or three layers of a PCB 100, 200. The layers shown in the figure could be any layers within the PCB 100, 200 (i.e., 1 to 2 or n to n−1) and can be internal to the PCB 100, 200. There can be multiple layers of microvias in the PCB 100, 200 where the disclosed process can be applied.

Embodiments of the present disclosure relate to a process to mitigate CAF growth in a PCB. The disclosure involves methods for creating a glass-free barrier layer, which isolates a glass weave from conductors. It is common for CAF growth to occur between different conductive/metallic features along glass weaves present in PCBs. Whether due to a hollow glass filament, a poor resin-glass bond, or poor resin impregnation within a glass bundle, a void without resin is a prime location for CAF growth. A glass-free layer creates a nonconductive barrier between the conductive/metallic source and glass weave so that even if a path exists, it cannot connect to another conductive/metallic feature.

One feature and advantage of the disclosed process is it provides an enhanced mechanism for preventing CAF formation and growth in PCBs. Another feature or advantage of the disclosed process is that the included operations can utilize equipment that PCB manufacturers have and know how to use. In addition, another feature or advantage is that the process can also utilize materials that PCB manufacturers are familiar with. A further feature or advantage is that the disclosed process includes as few process operations as possible in order to mitigate CAF growth.

For purposes of this disclosure, reference will be made to an illustrative process flow to mitigate CAF growth in a PCB. Of course, the disclosure herein should not be considered to be limited to the illustrative examples depicted and described herein. With reference to the attached figures, various illustrative embodiments of the methods and devices disclosed herein will now be described in more detail.

Figure 5:
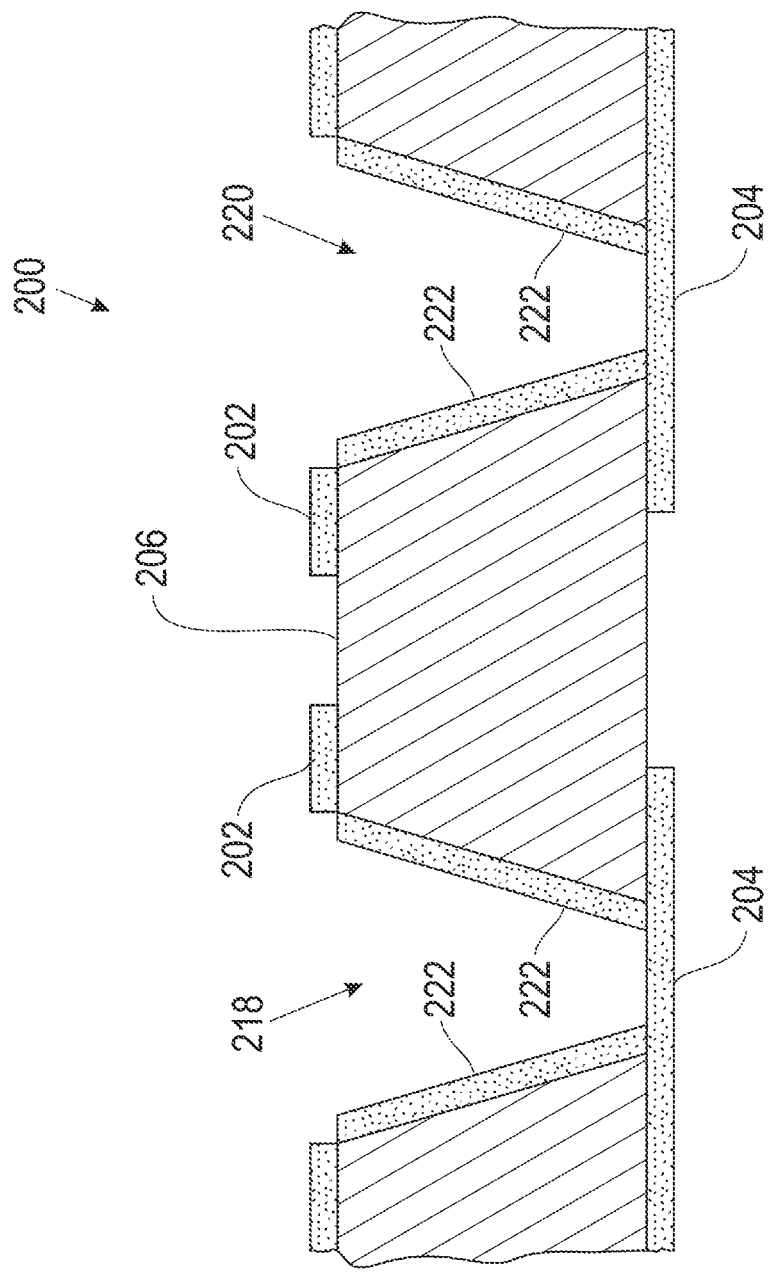
Figure 6:
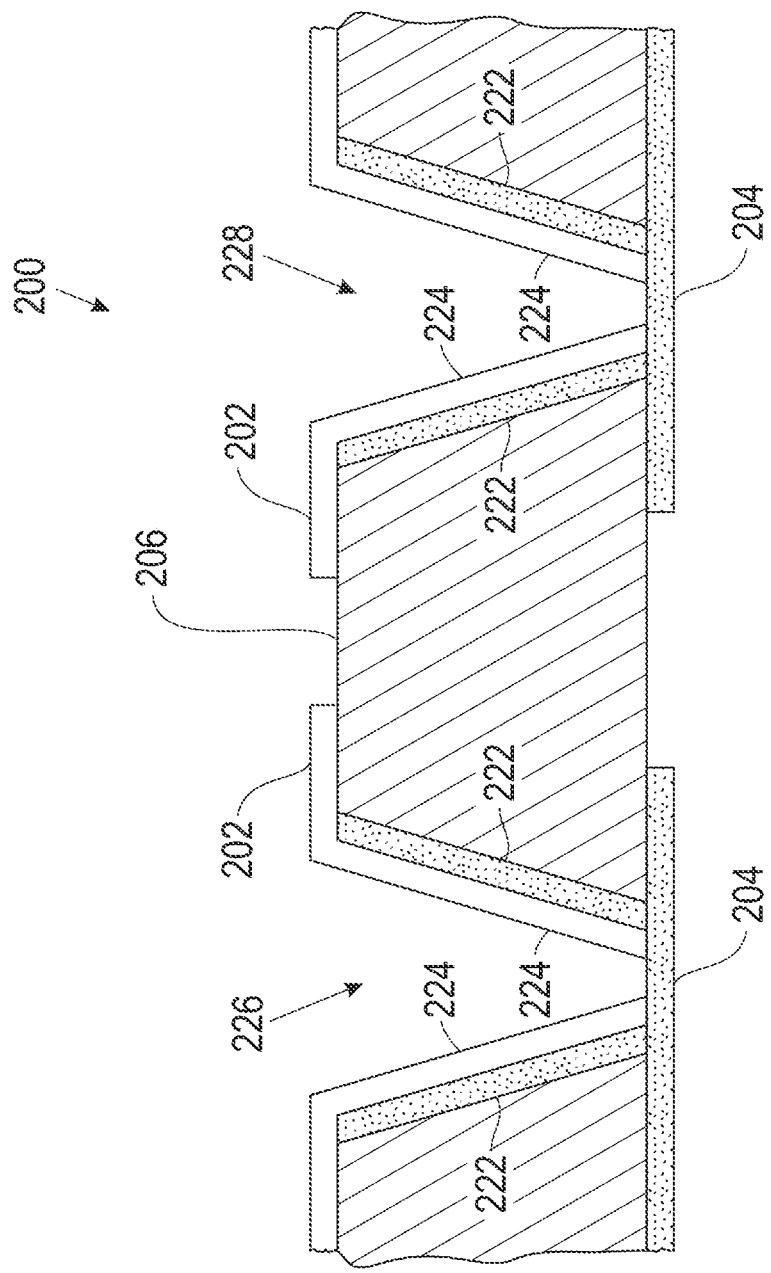
Figure 7:
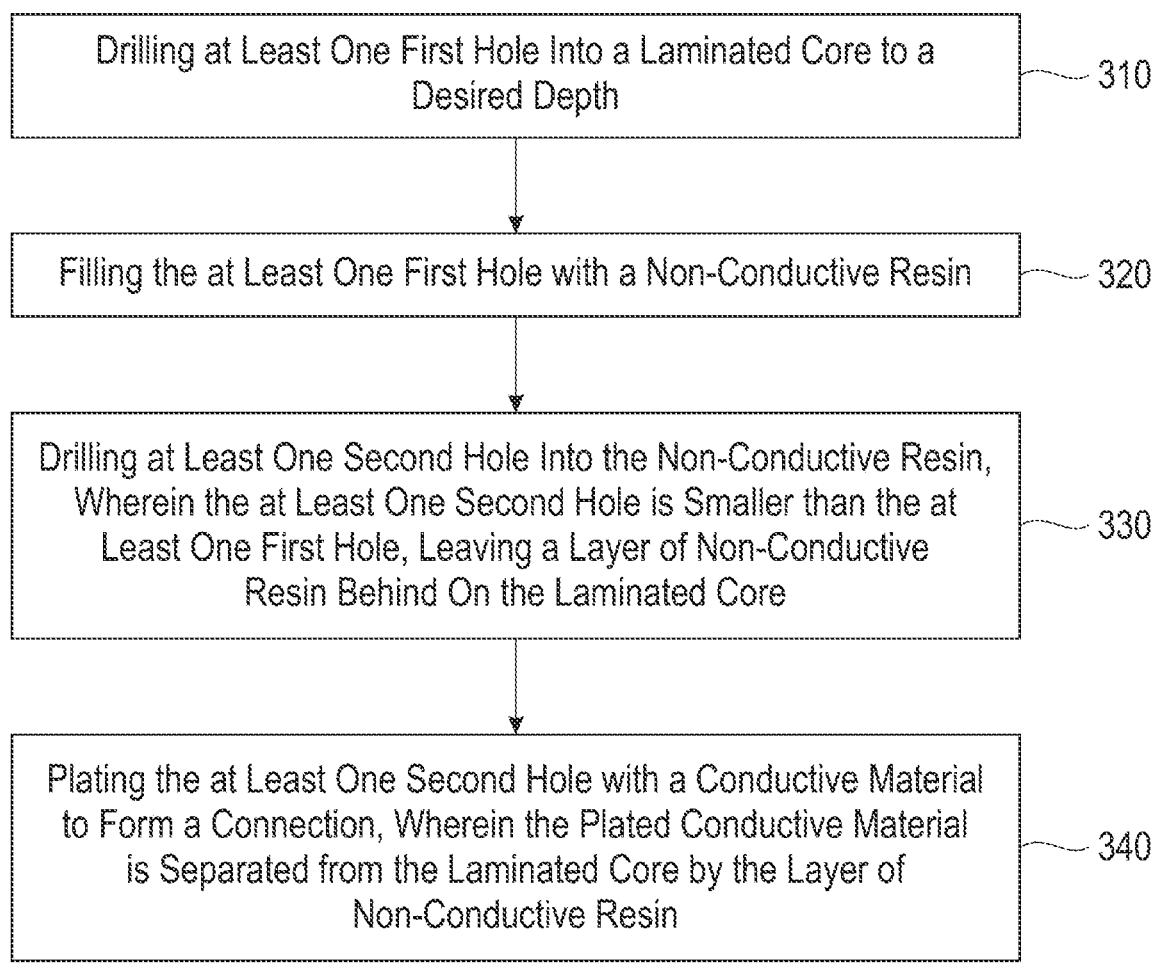
FIG. 7 is a flow diagram of a process to mitigate CAF growth in a PCB, in accordance with embodiments of the disclosure.

FIGS. 2-6 include schematic illustrations of cross-sectional views of a portion of a PCB 200 through steps or operations of an example process (such as process 300 in FIG. 7). The attached drawings present various views of one illustrative embodiment of a process or method to mitigate CAF growth in the PCB 200. PCB 200 is one example, and can include additional conductive and dielectric layers, for example.

Figure 2:
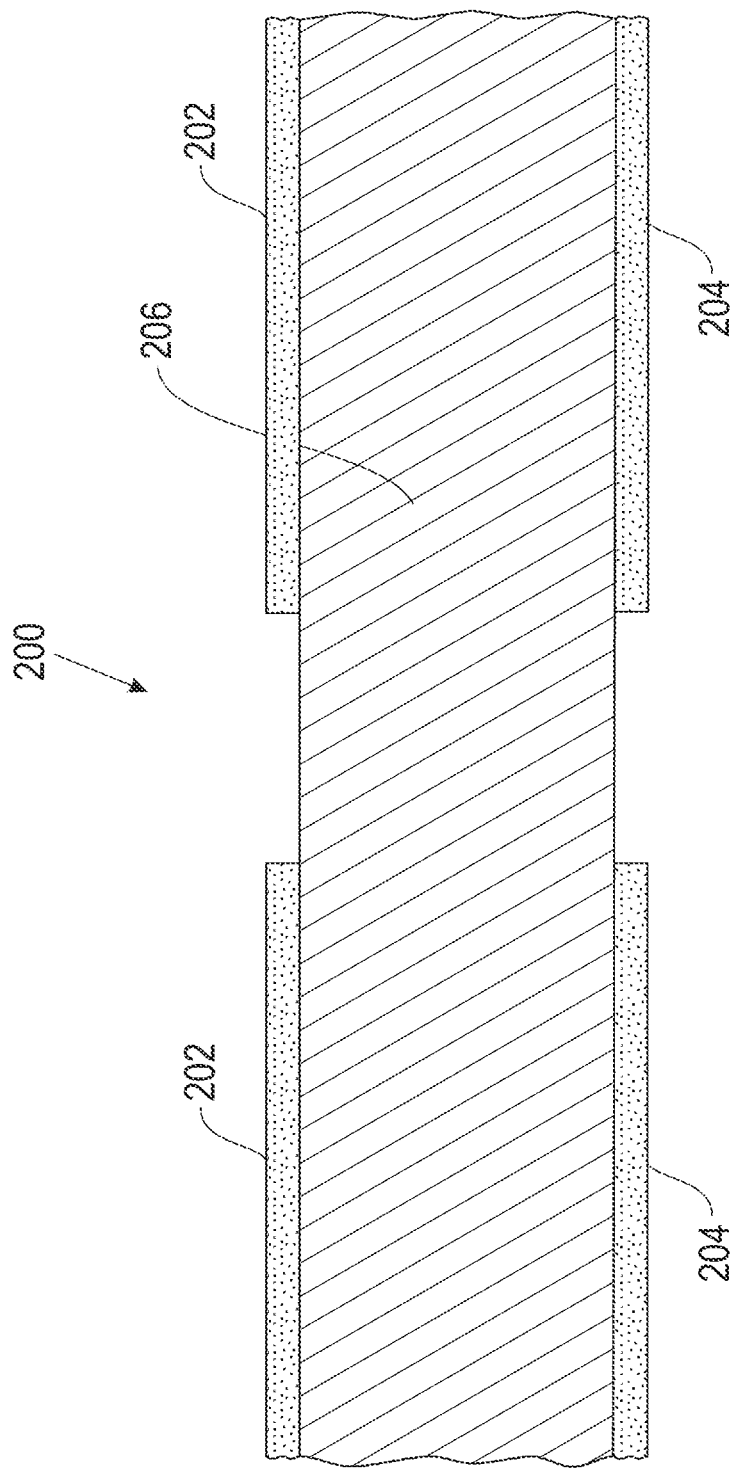
FIGS. 2-6 illustrate cross-sectional views of a PCB after a series of operations of a process are performed in order to mitigate CAF formation in the PCB, in accordance with embodiments of the disclosure.

FIG. 2 shows a cross-section of a portion of the PCB 200 during an early stage in the manufacturing process of a multi-layer PCB. Other operations in the process that are conventional PCB fabrication techniques are contemplated as being used in the process, but may not be described herein. The PCB 200 can include multiple layers, or can be a laminated structure. FIG. 2 shows an outer conductive layer 202 and an inner conductive layer 204 separated by a dielectric layer 206. The outer and inner conductive layers 202, 204 can include one or more metallic materials or features. The metallic materials can include copper. The dielectric layer 206 can comprise a nonconducting substance, that is, an insulator, having a permittivity with respect to an electric field. One example of a suitable dielectric material for the dielectric layer can be a resin reinforced with a glass weave (or woven glass fibers), one example of which is FR4 that includes a woven fiberglass cloth with an epoxy resin binder. The dielectric layer 206 can be an epoxy-based material, for example, although other materials, such as, but not limited to, polyimide, polyphenylene ether, or polytetrafluoroethylene, are contemplated.

Figure 3:
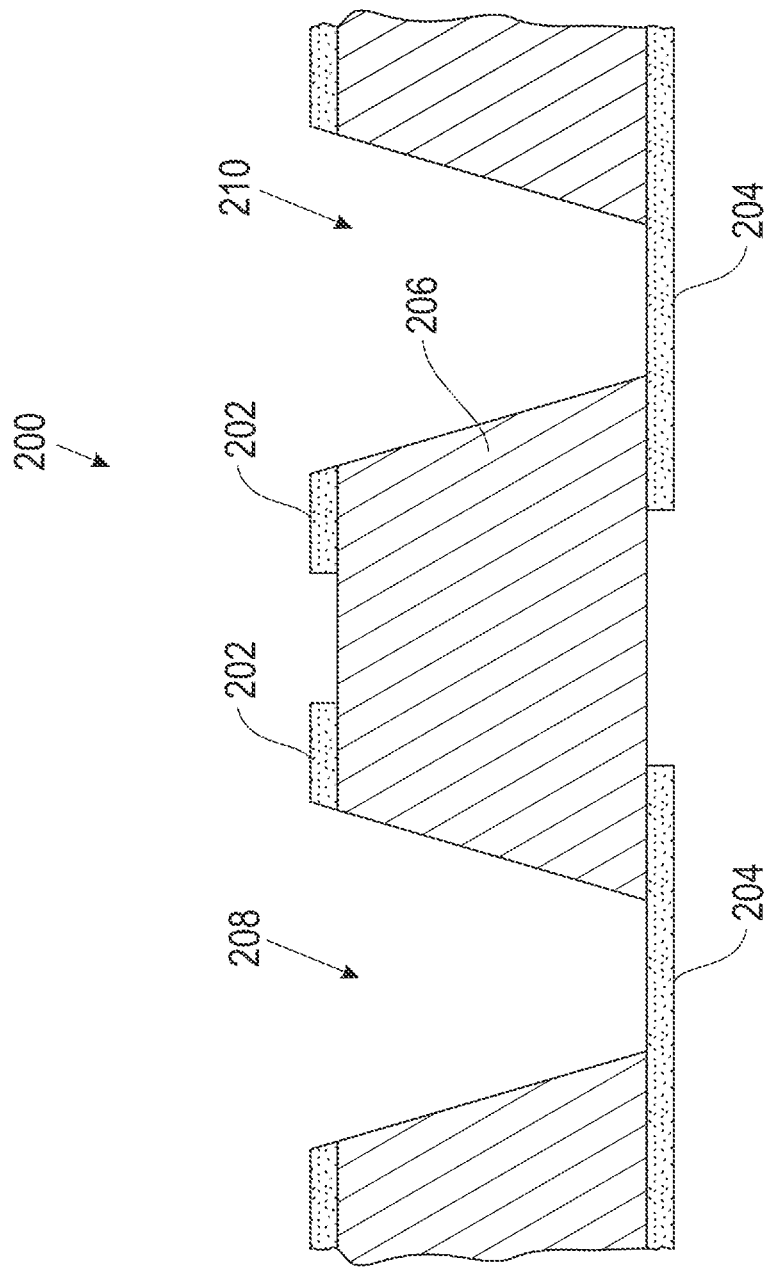

FIG. 3 shows a subsequent operation in the disclosed process to FIG. 2. The portion of PCB 200 is shown in FIG. 3 to include a first hole 208 and a second hole 210. Such first and second holes 208, 210 can be created by drilling into the PCB 200 through the outer conductive layer 202 and the dielectric layer 206, and down to the inner conductive layer 204. The drilling can be performed using a laser or mechanical method, for example. The purpose of the drilling can be, for example, to eventually connect a desired metallic feature of the inner conductive layer 204 to a metallic feature on the outer conductive layer 202. Additional process operations (described below and shown in FIGS. 4-5) are performed before plating is performed resulting in microvias, which can connect the metallic features of the inner conductive layer 204 to the metallic features of the outer conductive layer 202.

The shape of the holes 208, 210 can be circular. Alternatively, the holes 208, 210 can be columnar or frustoconical in shape. Other suitable shapes are also contemplated.

Figure 4:
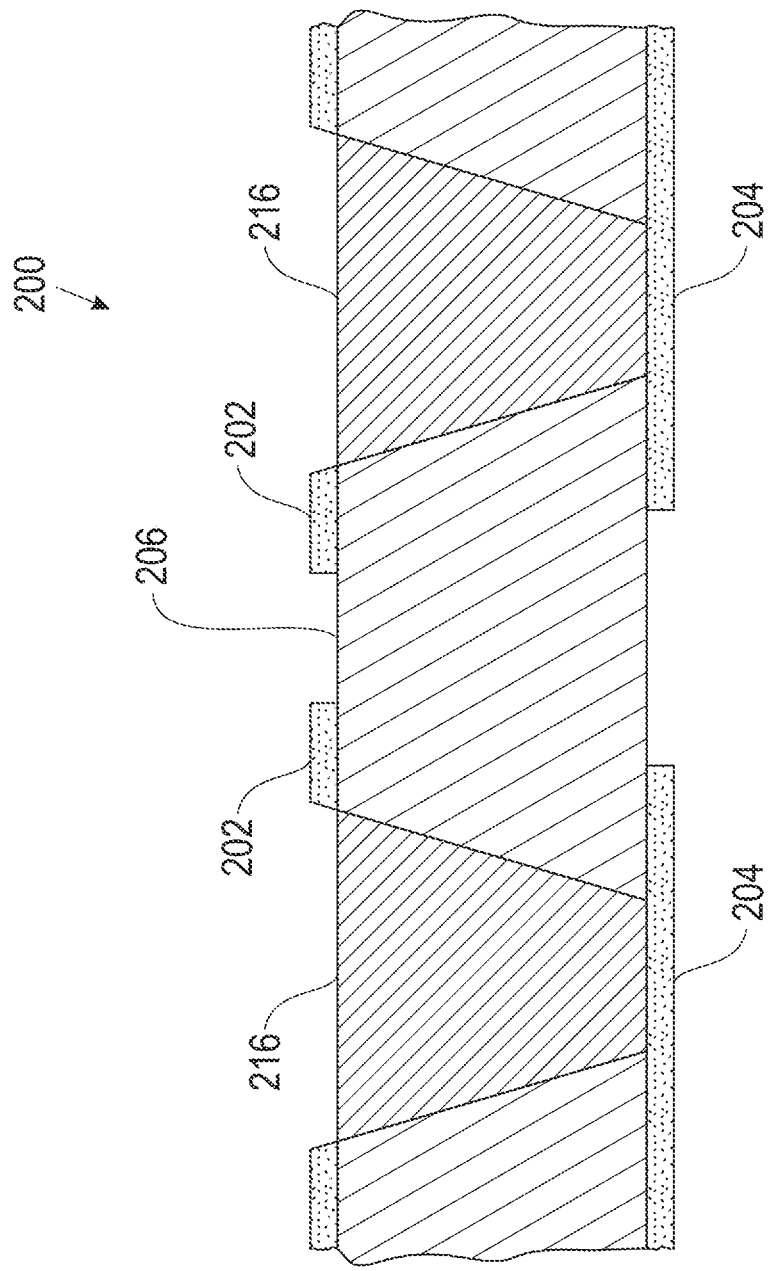

FIG. 4 illustrates the PCB portion 200 in another operation after the holes 208, 210 are drilled (as shown in FIG. 3). The holes 208, 210 are filled with a nonconductive resin 216, which can be epoxy-based. The nonconductive resin 216 can be applied or filled in the holes 208, 210 by a vacuum process or a liquid flow process, for example.

FIG. 5 illustrates the PCB 200 after a next operation in the process of making the PCB 200 is performed. As shown, the nonconductive resin 216 in holes 208, 210 undergoes a second drilling process to reform first and second holes 208, 210. The resulting third hole 218 and fourth hole 220, as shown in FIG. 5, comprise slightly smaller-sized holes (third and fourth holes 218, 220), which are smaller in diameter, to leave a nonconductive barrier or layer 222 between a newly plated hole (in subsequent FIG. 6) and glass weave in the dielectric layer 206. The nonconductive layers 222, left behind on the circumference of third and fourth holes 218, 220, will act as a glass-free layer.

The shape of the holes 218, 220 can be circular. Alternatively, the holes 218, 220 can be columnar or frustoconical in shape. Other suitable shapes are also contemplated.

Before a next operation of plating takes place, a desmearing, or hole cleaning, process can be performed. Such a desmearing process can clean residue off the inner conductive layer 204, for example, within the third and fourth holes 218, 220, prior to plating of conductive material thereon.

FIG. 6 illustrates the portion of the PCB 200 after the third and fourth holes 218, 220 are plated with conductive plated layers 224, and metallic connections are formed between the inner conductive layer 204 and the outer conductive layer 202. The nonconductive layers 222 remain left behind between the dielectric layer 206 and the conductive plated layers 224. The nonconductive layers 222 will act as a glass-free layer, and will reduce the potential for CAF growth to occur in the dielectric layer 206 between first and second microvias 226, 228. FIG. 6 shows the first and second microvias 226, 228 formed after the third and fourth holes 218, 220 (in FIG. 5) have been metallized, for example, by plating the walls of the third and fourth holes 218, 220 (in FIG. 5) over the nonconductive layers 222 to form the microvias 226, 228.

The attached drawings present various views of one illustrative embodiment of a PCB structure configured to mitigate CAF growth during a process of manufacturing PCB 200. As shown in FIG. 6, the PCB 200 can be an electronic printed circuit board structure that includes the dielectric layer 206. The dielectric layer 206 can include resin reinforced with woven glass fibers. At least one via or hole extends through the dielectric layer 206, which are the first and second microvias 226, 228 in the figure. A layer of nonconductive material 222 can be located between the dielectric layer 206 and conductive plate layers 224 to form connections in the structure. As a result of the plating, the first and second microvias 226, 228 are formed. The resulting first and second microvias 226, 228 are CAF-resistant.

The structure of PCB 200 can further include a plurality of conductive layers (examples are inner conductive layer 204 and outer conductive layer 202), wherein the at least one via extends between the plurality of conductive layers. The plurality of conductive layers can comprise metallic material.

Another embodiment of the disclosure, not shown, can involve mitigating CAF growth in PCBs with skip vias extending between three (3) or more layers. Yet another embodiment, not shown, can include a process applied to PTHs or slots without internal connections.

FIG. 7 is a flow diagram of a process 300 to mitigate CAF growth in a PCB 200 (as in FIGS. 2-6). The process 300 can include an operation of drilling 310 at least one first hole 208 or 210 (as in FIG. 3) into the printed circuit board 200, including a dielectric layer 206 (as in FIGS. 2-6) having a glass weave, to a desired depth. The printed circuit board 200 can include: a plurality of conductive layers (such as 202, 204 as in FIGS. 2-6), and at least one dielectric layer 206, wherein each dielectric layer 206 is sandwiched between two of the plurality of conductive layers 202, 204, and the at least one dielectric layer 206 includes resin reinforced by woven glass fibers. Another operation is filling 320 the at least one first hole 208 with a nonconductive resin 216 (as in FIG. 4). A further operation is drilling 330 at least one second hole 218 or 220 (as in FIG. 5) into the nonconductive resin 216, wherein the at least one second hole 218 or 220 is smaller in diameter than the at least one first hole 208 or 210, leaving a layer 222 (as in FIG. 5) of nonconductive resin behind on the circumference of the dielectric layer 206. Another operation is plating 340 the at least one second hole 218 or 220 with a conductive material 224 (as in FIG. 6) to form a connection, where the plated conductive material 224 is separated from the glass weave in the dielectric layer 206 by the layer 222 of nonconductive resin. Before plating, another operation can include cleaning the second hole 218 or 220 using a desmearing or hole cleaning process.

For purposes of description herein, the terms "upper," "lower," "top," "bottom," "left," "right," "rear," "front," "vertical," "horizontal," and derivatives thereof shall relate to the devices as oriented in the figures. However, it is to be understood that the devices can assume various alternative orientations and step sequences, except where expressly specified to the contrary. It is also to be understood that the specific devices and processes illustrated in the attached drawings, and described in the following disclosure, are simply exemplary embodiments of the inventive concepts defined in the appended claims. Hence, other physical characteristics relating to the embodiments disclosed herein are not to be considered as limiting, unless the claims expressly state otherwise.

For purposes of this description, certain aspects, advantages, and novel features of the embodiments of this disclosure are described herein. The disclosed processes, and systems should not be construed as being limiting in any way. Instead, the present disclosure is directed toward all novel and nonobvious features and aspects of the various disclosed embodiments, alone and in various combinations and sub-combinations with one another. The processes, and systems are not limited to any specific aspect or feature or combination thereof, nor do the disclosed embodiments require that any one or more specific advantages be present, or problems be solved.

Although the operations of some of the disclosed embodiments are described in a particular, sequential order for convenient presentation, it should be understood that this manner of description encompasses rearrangement, unless a particular ordering is required by specific language set forth below. For example, operations described sequentially can in some cases be rearranged or performed concurrently. Moreover, for the sake of simplicity, the attached figures may not show the various ways in which the disclosed processes can be used in conjunction with other processes. Additionally, the description sometimes uses terms like "provide" or "achieve" to describe the disclosed processes.

These terms are high-level abstractions of the actual operations that are performed. The actual operations that correspond to these terms can vary depending on the particular implementation and are readily discernible by one of ordinary skill in the art.

As used in this application and in the claims, the singular forms "a," "an," and "the" include the plural forms unless the context clearly dictates otherwise. Additionally, the term "includes" means "comprises."

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to explain the principles of the embodiments, the practical application or technical improvement over technologies found in the marketplace, or to enable others of ordinary skill in the art to understand the embodiments disclosed herein.

What is claimed is:

1. An electronic printed circuit board structure for mitigating conductive anodic filament growth, the structure comprising:
   an outer conductive layer and an inner conductive layer;
   a dielectric layer sandwiched between the outer conductive layer and the inner conductive layer;
   at least one via extending through the dielectric layer;
   a layer of conductive material located within and lining the at least one via, and connecting the outer conductive layer and the inner conductive layer; and
   a layer of nonconductive material located between the dielectric layer and the layer of conductive material lining the at least one via, wherein the layer of nonconductive material is glass-free.

2. The structure of claim 1, wherein the dielectric layer comprises resin reinforced by woven glass fibers.

3. The structure of claim 1, wherein the nonconductive material comprises an epoxy-based material.

4. The structure of claim 1, wherein the outer conductive layer, the inner conductive layer, and the layer of conductive material lining the at least one via comprise one or more metallic material.

5. The structure of claim 1, wherein the at least one via is selected from the group consisting of a microvia, a skip via, and a plated-through hole.

* * * * *